United States Patent [19]

Bohr et al.

[11] Patent Number: 4,505,026
[45] Date of Patent: Mar. 19, 1985

[54] CMOS PROCESS FOR FABRICATING INTEGRATED CIRCUITS, PARTICULARLY DYNAMIC MEMORY CELLS

[75] Inventors: Mark T. Bohr, Beaverton; Ken K. Yu, Portland; Leo D. Yau, Durham; Shyam G. Garg, Beaverton, all of Oreg.

[73] Assignee: Intel Corporation, Santa Clara, Calif.

[21] Appl. No.: 513,658

[22] Filed: Jul. 14, 1983

[51] Int. Cl.³ .................. H01L 21/306; H01L 21/31
[52] U.S. Cl. .................... 29/577 C; 29/571; 29/578; 29/579; 29/590; 29/591; 148/174; 156/643; 156/653; 156/657; 156/659.1; 357/54; 357/59; 427/86; 427/93
[58] Field of Search ............ 29/571, 577 C, 578, 29/579, 590, 591; 148/174; 427/86, 93; 156/643, 652, 653, 657, 659.1; 357/54, 59

[56] References Cited

U.S. PATENT DOCUMENTS

| | | | |
|---|---|---|---|
| 3,961,999 | 6/1976 | Antipov | 148/174 X |
| 4,044,454 | 8/1977 | Magdo | 29/578 |
| 4,110,125 | 8/1978 | Beyer | 156/643 X |
| 4,178,674 | 12/1979 | Liu et al. | 29/571 |
| 4,240,196 | 12/1980 | Jacobs et al. | 29/578 |
| 4,282,648 | 8/1981 | Yu et al. | 29/571 |
| 4,364,075 | 12/1982 | Bohr et al. | 357/23 |
| 4,372,034 | 2/1983 | Bohr | 29/577 C |
| 4,394,406 | 7/1983 | Gardiner et al. | 427/86 |
| 4,447,290 | 5/1984 | Matthews | 156/657 X |

Primary Examiner—William G. Saba
Attorney, Agent, or Firm—Blakely, Sokoloff, Taylor & Zafman

[57] ABSTRACT

A CMOS process is described which is particularly suited for forming dynamic memory cells. The cells are formed in an n-well and a single plate member formed from a first layer of polysilicon is used for the entire array. Unique etching of the first polysilicon layer prevents stringers from occurring when the second layer of polysilicon is deposited. A tri-layer dielectric is used for the capacitors in the array. Novel "rear-end" processing is disclosed using a phosphorus doped glass.

5 Claims, 18 Drawing Figures

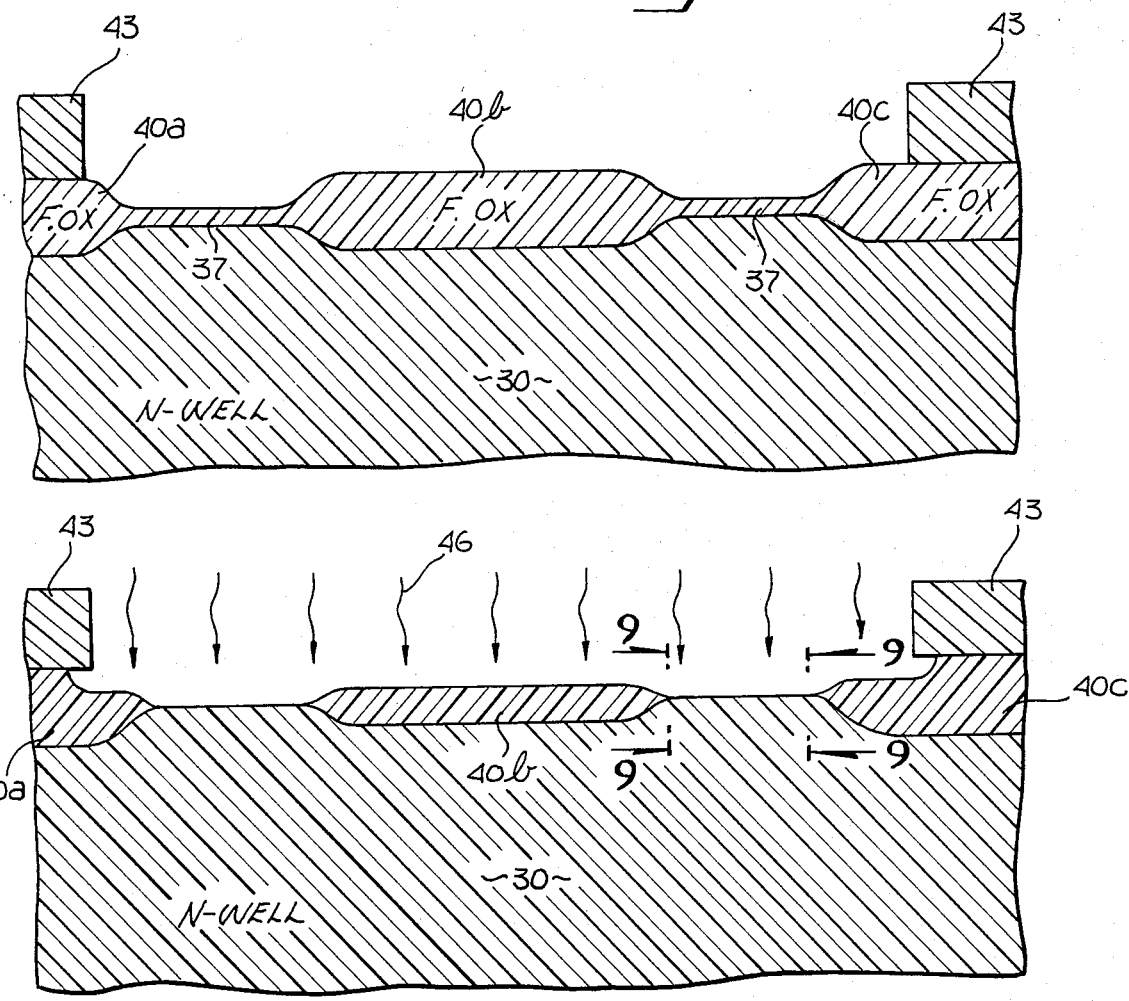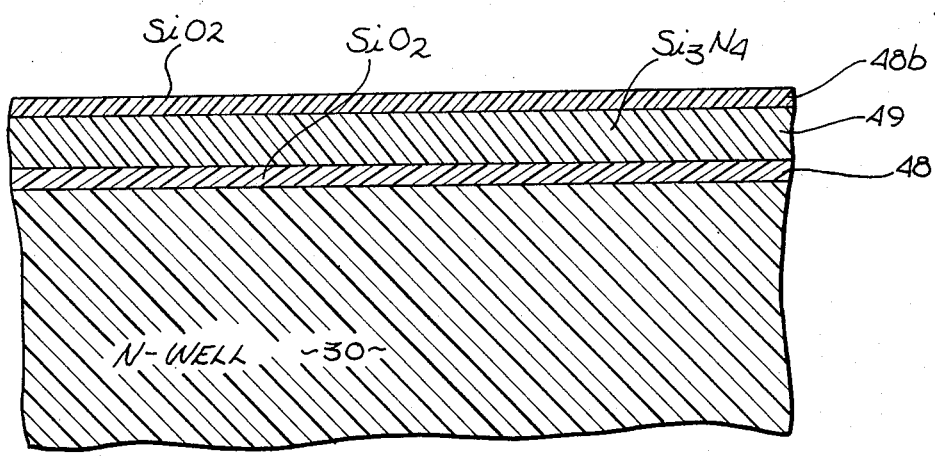

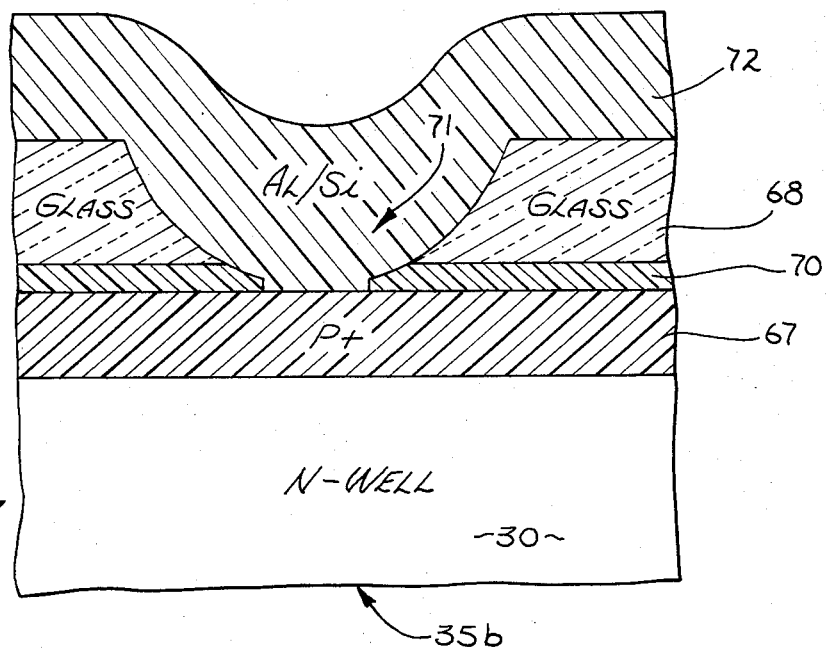
_Fig. 17_
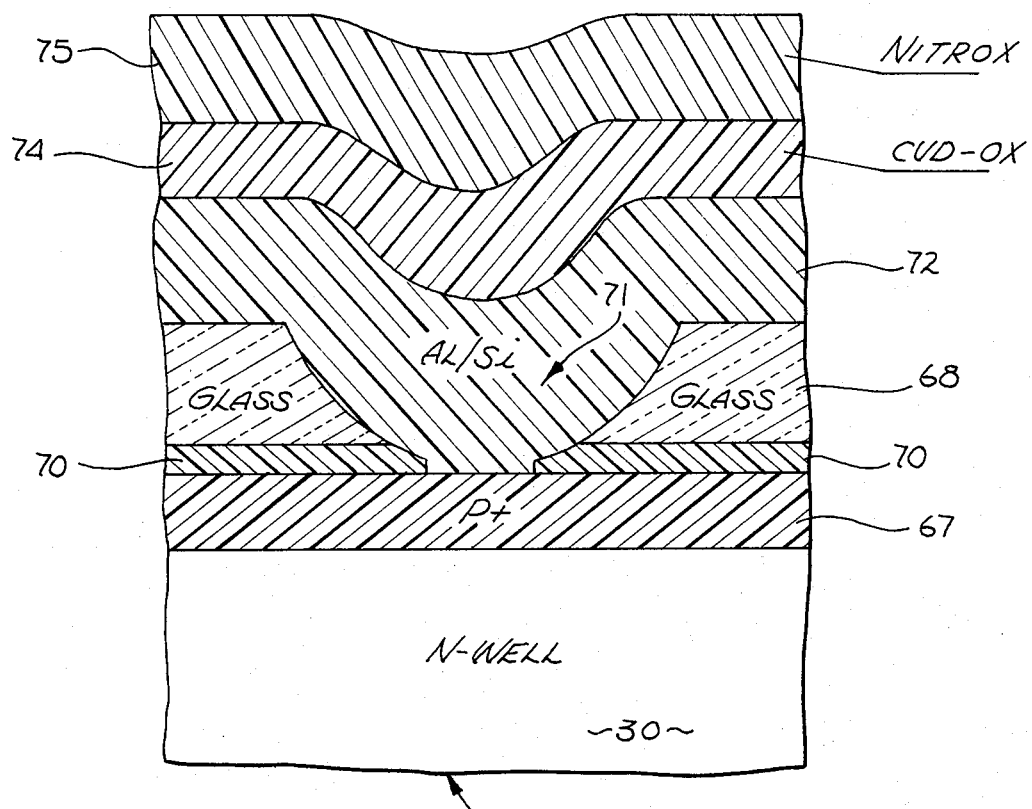
_Fig. 18_

CMOS PROCESS FOR FABRICATING INTEGRATED CIRCUITS, PARTICULARLY DYNAMIC MEMORY CELLS

BACKGROUND OF THE INVENTION

1. Field of the Invention

The invention relates to the field of CMOS processing, particularly processing for the fabrication of dynamic memory cells.

2. Prior Art

Complementary, metal-oxide-semiconductor (CMOS) transistors also known as COS/MOS transistors are well-known in the art and are frequently used in applications requiring low power. CMOS field-effect transistors are characterized by high switching speeds and very high noise immunity over a wide range of power supply voltages. Moreover, CMOS circuits are particularly immune to "soft failures" associated with minority carriers generated by alpha particles.

One problem with CMOS circuits has been their tendency to "latch up." The numerous junctions used to form the n-type and p-type transistors cause parasitic, transistor-like, paths. When transistor-like action occurs in one of the parasitic paths, the integrated circuit is typically destroyed. One prior art technique for preventing latch-up is to form the integrated circuit in an epitaxial layer which layer is formed over a very heavily doped substrate. The presently described process employs this combination of a heavily doped substrate and more lightly doped epitaxial layer to reduce latch-up problems and sensitivity to input voltage undershoots.

The invented process is an improvement over the process described in U.S. Pat. No. 4,282,648. The closest cell structure to that fabricated with the present invention which Applicant is aware of, is described in co-pending application, Ser. No. 182,870 filed Sept. 2, 1980, entitled "CMOS Dynamic RAM Cell and Method of Fabrication." This application is assigned to the assignee of the present invention.

SUMMARY OF THE INVENTION

A CMOS process is described which is particularly useful for forming dynamic memory cells. A first layer of polysilicon is used to form a plate over a well, this plate being used as part of the storage capacitors of the cells. The etching of this first layer of polysilicon includes the steps of first growing a silicon dioxide layer on the upper surface of the polysilicon layer and then forming a second silicon dioxide layer over the grown oxide layer by using chemical vapor deposition. Patterns are defined over the second silicon dioxide layer using a photoresist layer and ordinary masking step. The second silicon dioxide layer is etched employing a wet etchant such that this layer is undercut beneath the photoresist. Then the grown silicon dioxide layer is etched in alignment with the photoresist layer using an anisotropic plasma etching step. The polysilicon layer is now etched using a wet etchant such that undercutting occurs beneath the grown silicon dioxide layer. After overhangs of the grown silicon dioxide layer extending from between the polysilicon layer and second silicon dioxide layer are removed, a well sloped surface results along the etched etches of the silicon dioxide layers and polysilicon layer, allowing a second silicon layer to be formed with better step coverage (e.g., no stringers).

BRIEF DESCRIPTION OF THE DRAWINGS

FIG. 7 illustrates the n-well of FIG. 6 after a masking step.

FIG. 8 illustrates the structure of FIG. 7 after field-oxide regions have been etched back and during an ion implanation step.

FIG. 9 illustrates a portion of the substrate of FIG. 8 generally taken between the section lines 9—9. This view is used to illustrate the dual dielectric used in the capacitors.

FIG. 17 illustrates a portion of the substrate of FIG. 16 (at section lines 17) with an opening etched through the glass layer and after the deposition of a conductive layer.

FIG. 18 illustrates the structure of FIG. 17 after additional passivation layers are formed.

DETAILED DESCRIPTION OF THE INVENTION

A complementary metal-oxide-semiconductor (CMOS) process is described which is particularly useful for the formation of dynamic memory cells. In the following description, numerous specific details are set forth such as specific layer thicknesses, etc., in order to provide a thorough understanding of the present invention. However, it will be obvious to one skilled in the art that the present invention may be practiced without these details. In other instances, well-known processing steps, such as cleaning steps, etc., have not been set forth in detail in order not to unnecessarily obscure the present invention.

The present invention describes the fabrication of dynamic memory cells each of which includes a capacitor and field-effect transistor. Cells employing a single active device as part of dynamic memories are well-known in the prior art. The cells of the present invention are employed in a random-access memory, the circuits of which are described in more detail in copending application Ser. No. 470,454 filed Feb. 28, 1983, entitled CMOS DRAM and assigned to the assignee of the present invention.

Some of the processing steps described below may be used to form circuit structures other than dynamic random-access memories. This is particularly true for the etching steps used for etching the first layer of polysilicon and the "rear-end" processing.

Figure 1:
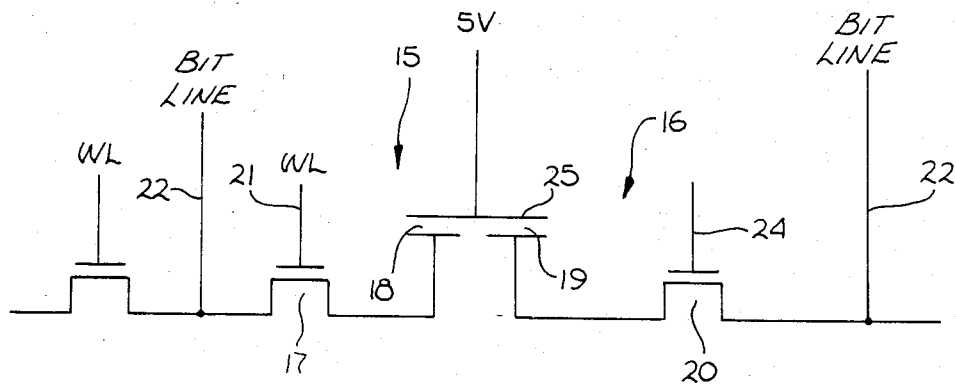
FIG. 1 is a circuit diagram showing capacitive storage, dynamic memory cells in the general orientation in which they are fabricated with the present invention.

Referring first to FIG. 1, two complete memory cells 15 and 16 are illustrated. Charge for cell 15 is stored on capacitor 18, while charge for cell 16 is stored on capacitor 19. The capacitors share a common upper plate 25. As will be seen, this plate is a continuous plate used for the entire memory array. Capacitor 18 is coupled to the bit line 22 through the field-effect transistor 17. The gate of this transistor is part of word line 21 in the memory array. Similarly, capacitor 19 is coupled to bit line 22 through the field-effect transistor 20. The gate of this transistor comprises the word line 24.

Figure 2:
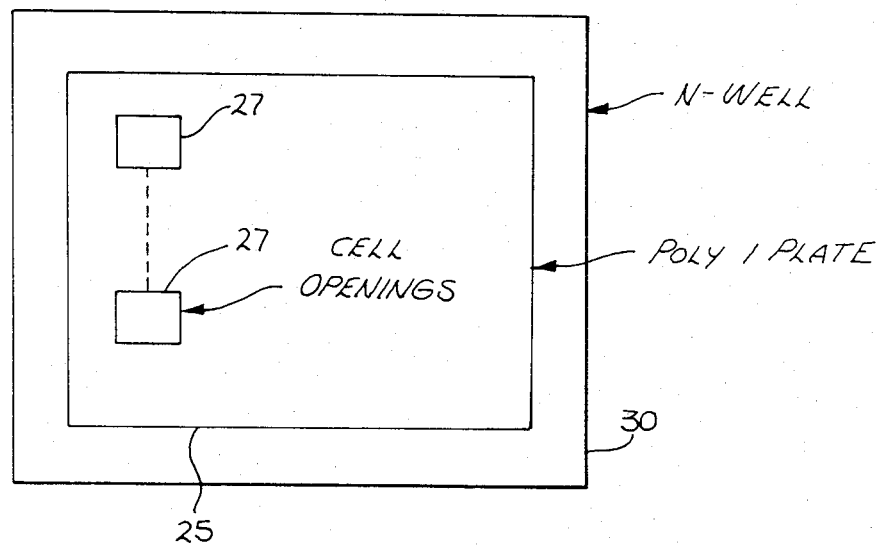
FIG. 2 is a plan view of the storage array showing openings through a first polysilicon layer. This layer is used as a plate for the capacitors of the circuit of FIG. 1.

As will be described in greater detail, the memory cells such as those shown in FIG. 1 are formed in and on a single n-well. N-well 30 is shown in FIG. 2 in plan view. The first layer of polysilicon 25 which forms the upper plate for the capacitors is formed over the n-well and a plurality of openings such as openings 27 are formed through the layer 25. The field-effect transistors such as transistors 17 and 20 are formed within these openings.

Figure 3:
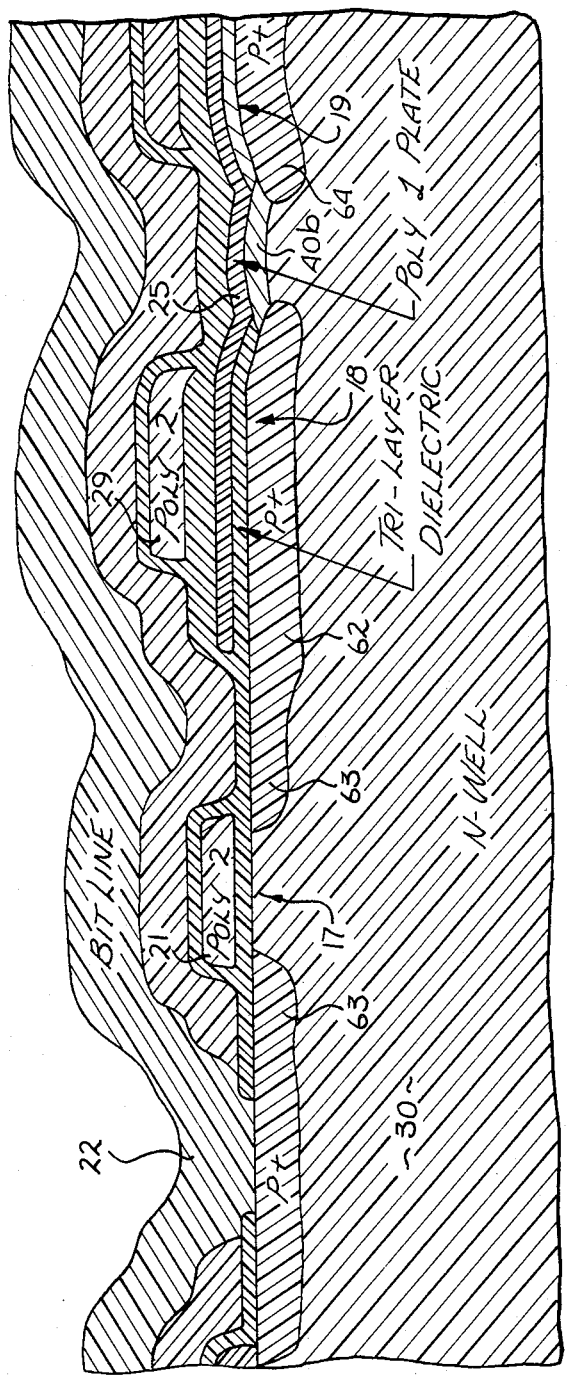
FIG. 3 is a cross-sectional elevation view of a substrate with memory cells fabricated in accordance with the present invention.

Referring to FIG. 3, the memory cells of FIG. 1 are illustrated after fabrication in accordance with the present invention. A portion of the n-well 30 of FIG. 2 is shown in FIG. 3. The capacitor 18 of FIG. 1 is formed by the p+ region 62, a dual dielectric and the plate 25. The plate 25 is shared with the capacitor 19 and extends over the p+ region 64. The regions 62 and 64 are separated by a field-oxide region 40b. The capacitor 18 is coupled to the bit line 22 through the transistor 17. This transistor as in the case of FIG. 1 comprises the word line 21 which is formed from a second layer of polysilicon and the source and drain regions 63. One of these regions is continuous with region 62. In the presently preferred embodiment, the memory cells are arranged along folded bit lines with alternate word lines being used to activate transistors along half the folded word line. Thus, as may be seen in FIG. 3, the word line 29 for the portion of the bit lines shown in FIG. 3 not act as a gate. In the other half of the folded bit line, word line 29 is a gate, but word line 21 is above the plate 25 and does not act as a gate.

Figure 4:
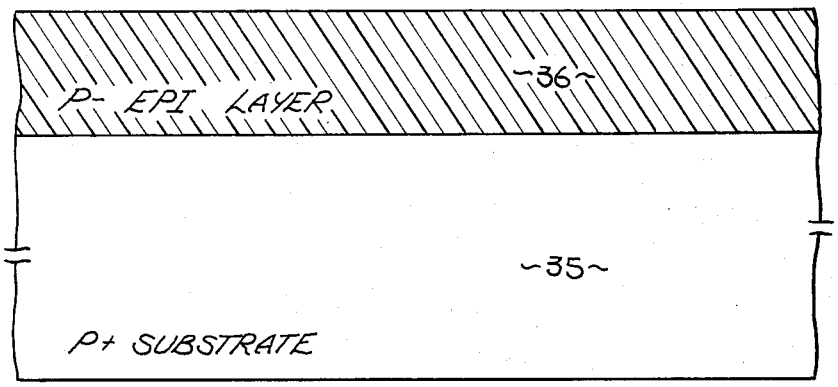
FIG. 4 is a cross-sectional elevation view of a substrate which includes an epitaxial layer.

Referring now to FIG. 4, the processing of the present invention begins with a monocrystalline silicon p+ substrate 35 on which a p− epitaxial layer 36 is formed. As mentioned, the combination of the more heavily doped substrate and more lightly doped epitaxial layer reduces latch up. In the presently preferred embodiment, the substrate is doped to a level of 0.01–0.02 ohm-cm. The layer 36 is doped to a level of 30–50 ohm cm and is approximately 10–13 microns thick.

Figure 5:
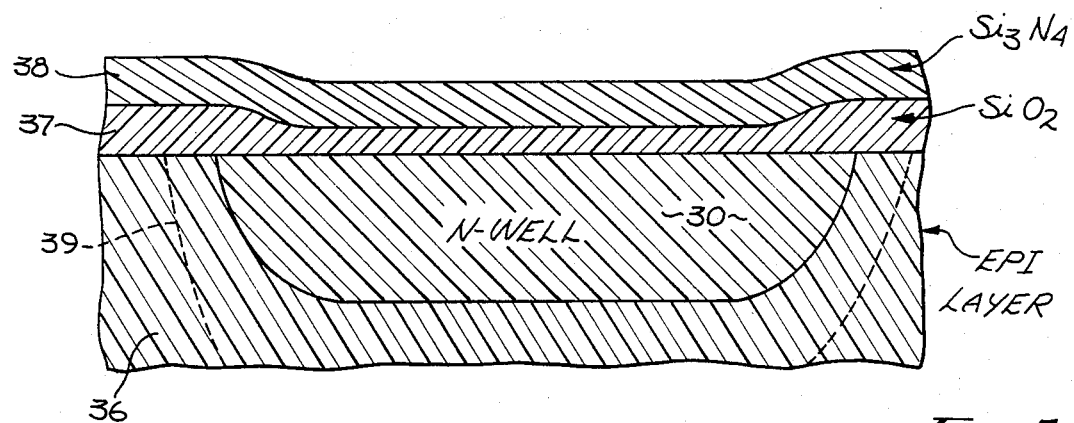
FIG. 5 illustrates the structure of FIG. 4 after the formation of an n-well in the epitaxial layer.

The n-well 30 of FIG. 5 is formed in the layer 36 employing known processing. In the presently preferred embodiment, phosphorus is ion implanted at an energy level of 50 kev to a level of approximately $5.2 \times 10^{12}/cm^2$. After the formation of a silicon dioxide layer 37 and a silicon nitride layer 38, an ordinary high temperature driver step is used to form the well 30 of about 3.5 microns deep. The well remains entirely within the epitaxial layer and is approximately 3.5 microns deep. As mentioned, all the memory cells are formed within the n-well 30. This n-well is coupled to 5 volts and when this occurs, a depletion region shown by dotted line 39 of FIG. 5 forms around the well. Minority carriers (electrons) are drawn into the pinch region between this depletion region and the more heavily doped substrate and recombined in the substrate. This helps prevent latch-up and sensitivity to input voltage undershoots. The depletion region from this well extends to the epitaxial layer/substrate interface. Minority carriers, for instance, caused by negative voltage overshoots, are absorbed by this well, particularly where the well surrounds input N+ regions.

Figure 6:
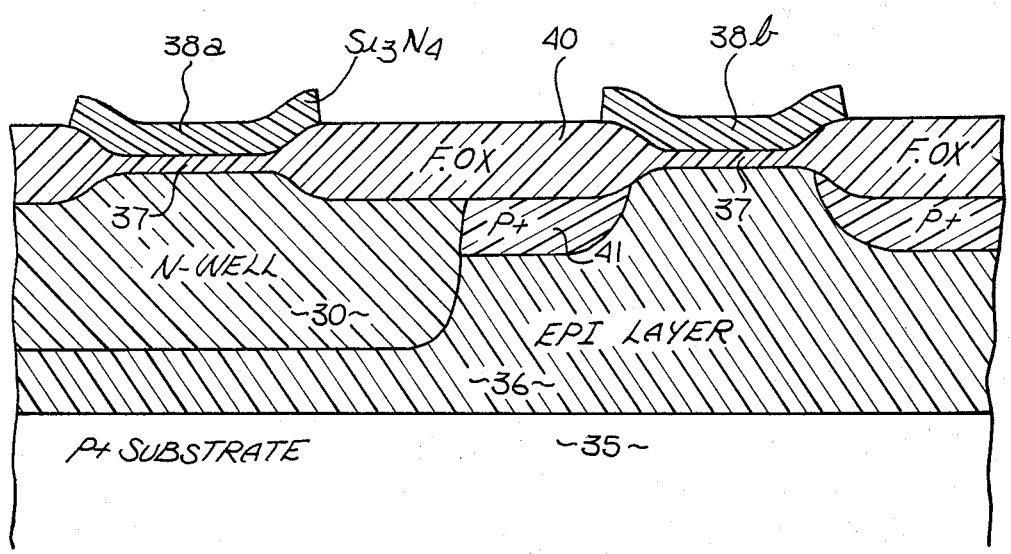
FIG. 6 illustrates the structure of FIG. 5 after the formation of field-oxide regions.

After the formation of the n-well 30, the silicon nitride layer 38 is etched to allow growth of field-oxide regions, as is known. Silicon nitride members 38a and 38b are shown in FIG. 6 after field-oxide region 40 has been grown. it should be noted that FIG. 6 shows the edge of the n-well, and the silicon nitride member 38b defines a region for the peripheral circuits used as part of the memory. Other processing steps are used to form the guardband 41 around the n-well as well as guardbands around n-wells in the peripheral region. The processing steps used to form this guardband are discussed in U.S. Pat. No. 4,282,648, particularly see FIGS. 2 through 5.

A photoresist layer is formed over the substrate and openings are formed in this layer at the areas where the capacitors are to be formed (e.g., capacitors 18 and 19 of FIG. 1). This is shown in FIG. 7 by the opening defined in the photoresist layer 43. This opening extends from one field-oxide region 40a to a field-oxide region 40c and includes the field-oxide region 40b. A wet etching step is used to etch off the oxide 37 and the exposed portions of the field-oxides 40a and 40c to a thickness of approximately 5000 A. These field-oxide regions are initially grown to a thickness of approximately 8000 A. Those field-oxide regions used as part of the capacitors are etched back to the approximately 5000 A thickness, while the other oxides remain at their original 8000 A thickness. This etching step reduces the "bird-beaks" and provides more area for the capacitors. Such etching is discussed in part in U.S. Pat. Nos. 3,961,999 and 4,044,454.

The effect of the etching back of the field-oxide regions is shown in FIG. 8. The thin oxide layer 37 is completely removed, the edges of the oxide members 40a and 40c are etched back, while the field-oxide region 40b is completely etched back to a thickness of approximately 5000 A. (Oxide 40b is shown in FIG. 3.) The effect of reducing the thickness of this oxide and its associated bird-beaks is to provide greater storage capacitance area for capacitors 18 and 19. The capacitor regions are subjected to ion implantation to form p-type regions in the well 30. In the presently preferred embodiment, boron is implanted at an energy level of 50 kev to obtain a dopant level of $2 \times 10^{14}/cm^2$. This is shown by lines 46 in FIG. 8. The oxide 40b is thick enough to prevent boron from being implanted beneath the oxide 40b and thus allowing the capacitors 18 and 19 of FIGS. 1 and 3 to be separate. This implantation step forms the regions 62 and 64 of FIG. 3.

In the presently preferred embodiment, a tri-layer dielectric is used to separate the plate 25 of FIG. 3 from the regions 62 and 64. The tri-layer dielectric is used only for the capacitors of the cells. The dielectric has been found to optimize cell capacitance and minimize defect density. To form this dielectric, first, a thin layer of silicon dioxide is grown on the surface of the substrate to a thickness of 50 A or less. This is shown as layer 48 in FIG. 9. Then approximately 140 A of silicon nitride (layer 49) is formed on the silicon dioxide layer. Finally, the silicon nitride layer is oxidized to form approximately 15 A of silicon dioxide on top (layer 48B).

Figure 10:
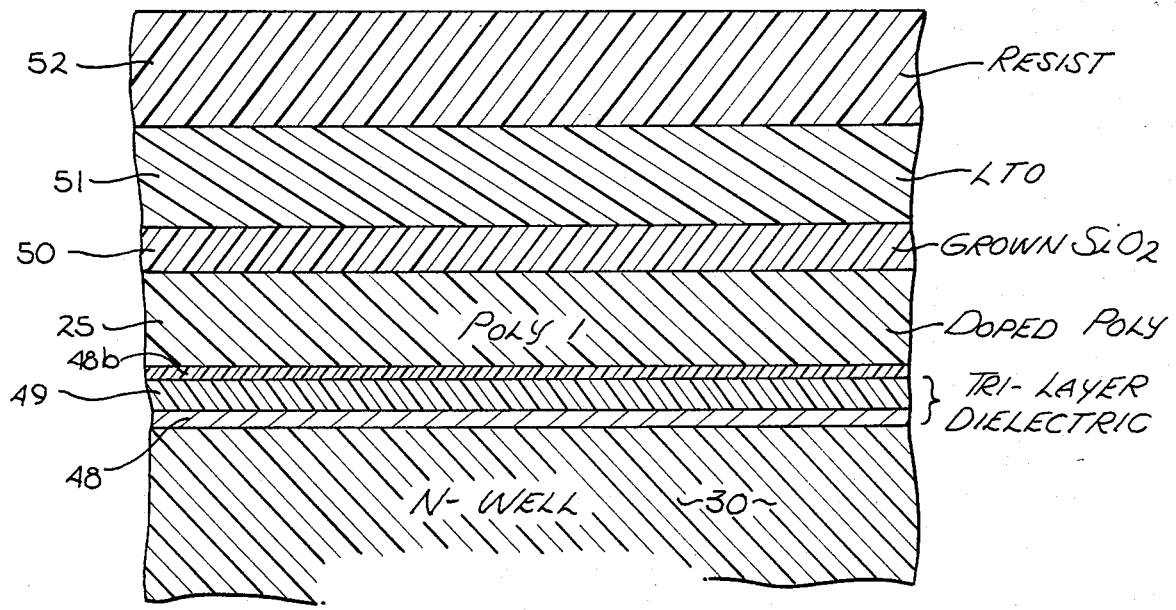
FIG. 10 illustrates the substrate of FIG. 9 after the formation of a polysilicon layer, grown silicon dioxide layer, low temperature silicon dioxide layer and photoresist layer.

Next as shown in FIG. 10 a phosphorus doped polysilicon layer (layer 25) is formed over the dual dielectric. Then a silicon dioxide layer is grown on the upper surface of the polysilicon layer 25. Now a low temperature silicon dioxide (chemical vapor deposition step) is used to form the layer 51. Finally, as shown in FIG. 10, a photoresist layer 52 is formed over the layer 51. In the presently preferred embodiment, the doped polysilicon layer 25 is approximately 2500 A thick, the layer 50 approximately 800 A thick, and the layer 51 approximately 4500 A thick.

Figure 11:
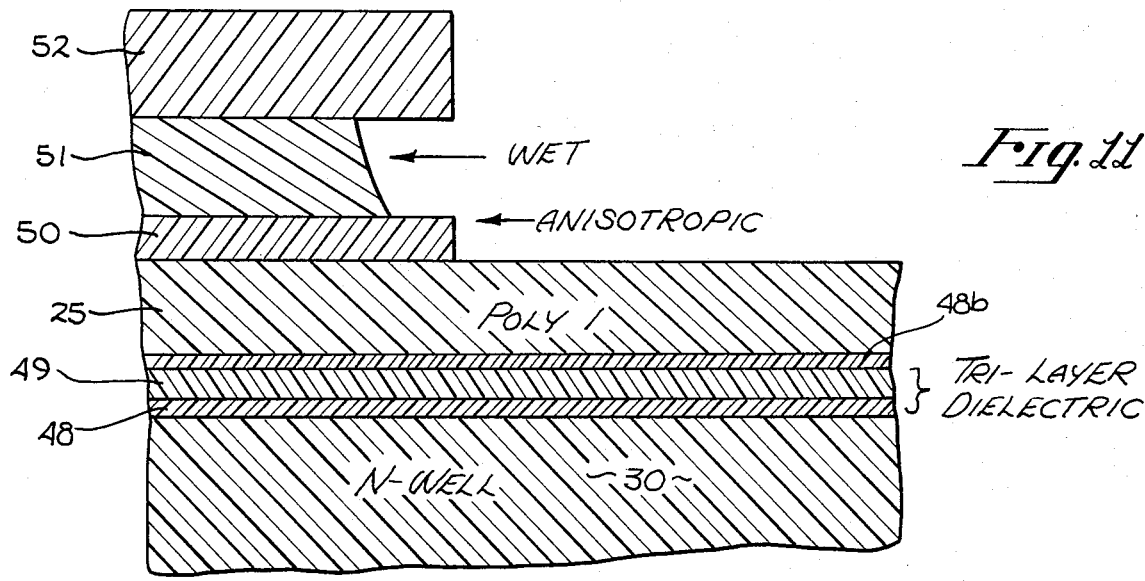
FIG. 11 illustrates the structure of FIG. 10 after a masking step and two etching steps.

An ordinary masking step is used to pattern the photoresist layer 52, for example, to define the openings 27 shown in FIG. 2. A wet etching step is used to etch the layer 51. Etching is continued to undercut the photoresist layer 52 (e.g., leaving an overhang of approximately 0.5 microns). The deposited silicon dioxide etches much faster than the underlying grown silicon dioxide so that the layer 50 remains somewhat unaffected during the etching of the layer 51. Now a plasma etching step employing an anisotropic etchant is used to etch the layer 50 in alignment with the photoresist layer 52. The resultant structure is shown in FIG. 11. A ordinary wet etchant is next used to etch the polysilicon layer 25. This etching step is continued to undercut beneath the layer 50 as shown FIG. 12 (e.g., leaving an overhang of approximately 0.5 microns).

Figure 12:
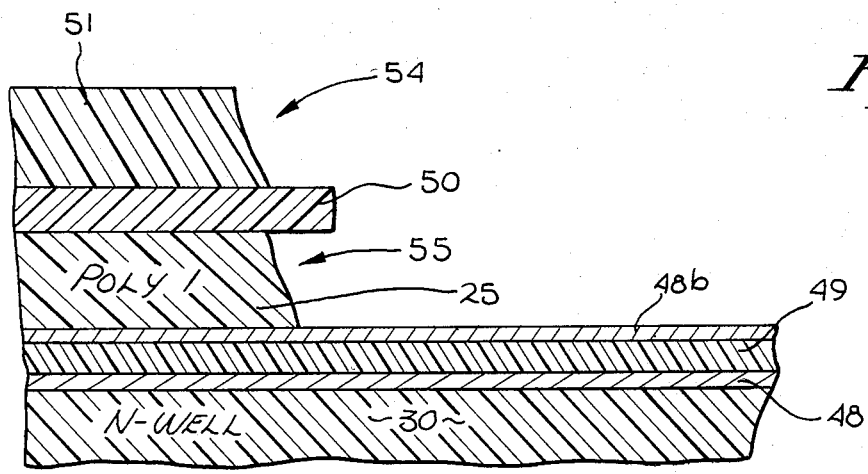
FIG. 12 illustrates the structure of FIG. 11 after an additional etching step.
Figure 13:
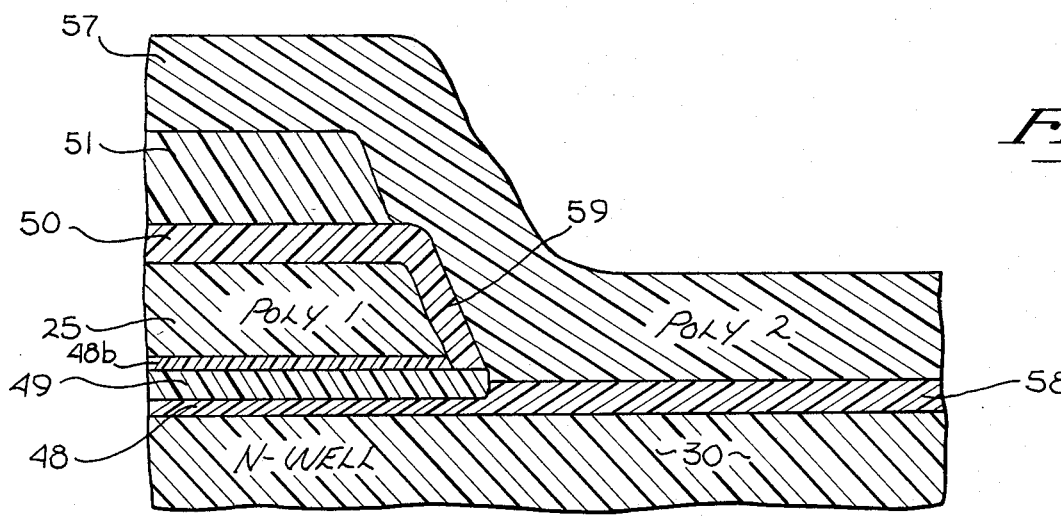
FIG. 13 illustrates the structure of FIG. 12 after an additional oxidation step and after the formation of a second polysilicon layer.
Figure 14:
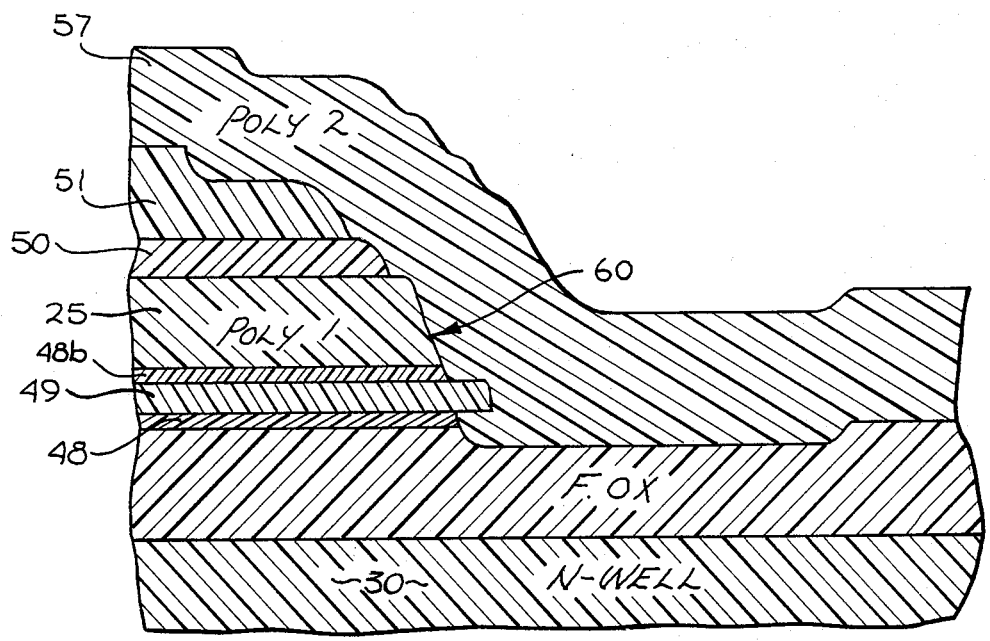
FIG. 14 illustrates the structure of FIG. 12 after the formation of a second polysilicon layer where a buried contact region is formed between the polysilicon layers.

It should be noted from FIG. 12 that the edges 54 and 55 of the layers 54 and 25, respectively, define a somewhat smooth, aligned, sloped contour. During subsequent processing, for example, the processing used to remove layers 48 and 49 in regions where they are not used, the overhanging portion of layer 50 is removed and a continuous slope is formed along the edges of the silicon dioxide layers 50 and 51 and the polysilicon layer 25. This smooth edge is quite important since it prevents "stringers" from forming when a subsequent polysilicon layer is deposited over the structure as shown in FIGS. 13 and 14. Moreover, the composite structure of the grown SiO2 and the deposited SiO2 provide excellent insulation.

Before the second layer of polysilicon is deposited, a gate oxide layer 58 is grown to provide insulation between the substrate and the gates of the field-effect transistors.

In the regions of the memory where the first polysilicon layer is to be insulated from the second polysilicon layer, an oxide is grown on the edge of the polysilicon layer as shown by oxide 59 of FIG. 13. In other regions where contact is to made between the second polysilicon layer and the first polysilicon layer, such as at the edge 60 of the layer 25 (as shown in FIG. 14), the edge oxide is removed by a standard masking step right before second polysilicon deposition. Thus, when the second polysilicon layer is deposited over the substrate in some regions it contacts the first layer of polysilicon and in other areas it does not. After deposition of the second layer of polysilicon it is patterned to form various circuit elements such as the word lines shown in FIGS. 1 and 3. For these lines the second polysilicon layer is insulated from the first polysilicon layer. In peripheral regions, there is need for the buried contacts formed at the surface 60 between the first and second layers of polysilicon. These contacts are used at the edge of the polysilicon plate 25 to couple the plate to 5 volts through the second polysilicon layer.

Well-known processing may be used to form the p-channel transistors in the n-well 30 and also to form p-channel transistors in other n-wells for the peripheral circuits. Well-known processing also may be used to form the n-channel transistors. The presently preferred "rear end" processing is described in conjunction with FIGS. 15 through 18 as follows.

Figure 15:
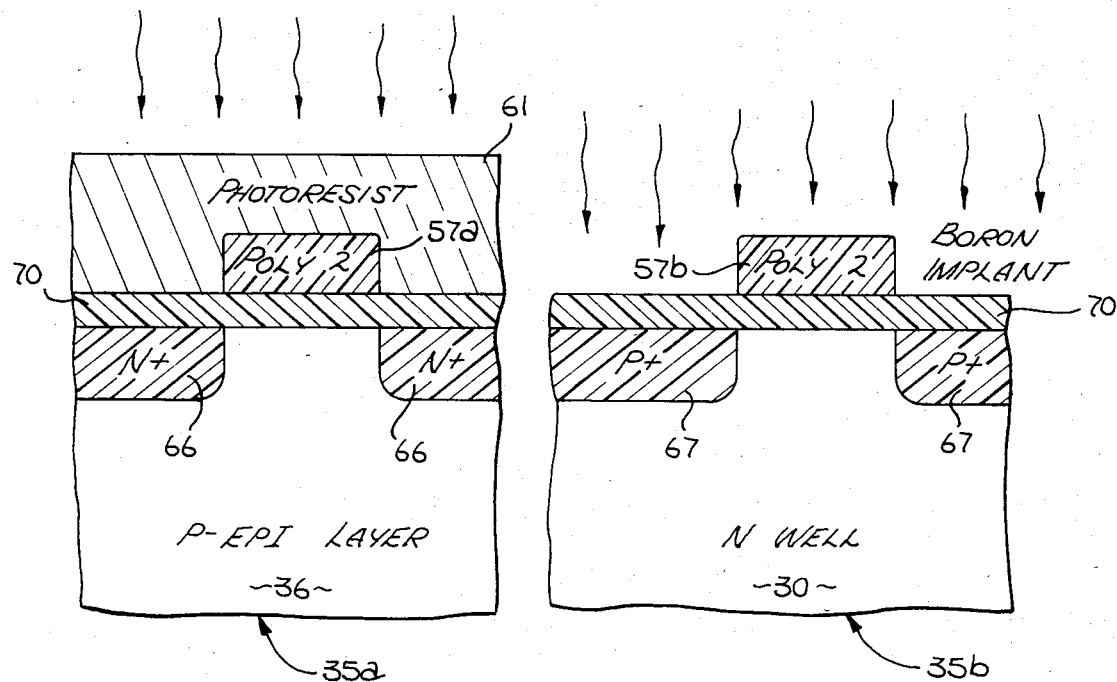
FIG. 15 is a cross-sectional elevation view of two portions of the substrate where n-channel and p-channel transistors are formed.

Two portions of the substrate (substrate portions 35a and 35b) are shown in FIG. 15. One portion is taken through an n-well, again identified as well 30. The other portion is spaced-apart from any of the n-wells and is shown as the p-type epitaxial layer 36. An n-channel transistor is shown formed on portion 35a and a p-channel transistor on portion 35b. By way of example, both portions of the substrate may be in the peripheral region of a memory fabricated with the described process. A gate oxide layer 70 which is a grown silicon dioxide layer, insulates the gates 57a and 57b from the transistor's channel regions. In the presently preferred embodiment, the gates for the field-effect transistors are formed from the second layer of polysilicon.

In the preferred processing, an arsenic implant is used to form the n-regions 66 is alignment with the gate 57a. For instance, arsenic is implanted at 50 kev to a level of $4 \times 10^{15}/cm^2$. As is customary, when this done, the sites for the p-channel transistors are covered with photoresist to prevent the arsenic from being implanted. A high temperature annealing step is now used.

Next, as shown in FIG. 15, a photoresist layer 61 is placed over the n-channel devices and a p-type dopant such as boron, is implanted to define regions 67. By way of example, boron is implanted at 50 kev to a level of $5 \times 10^{14}/cm^2$.

Figure 16:
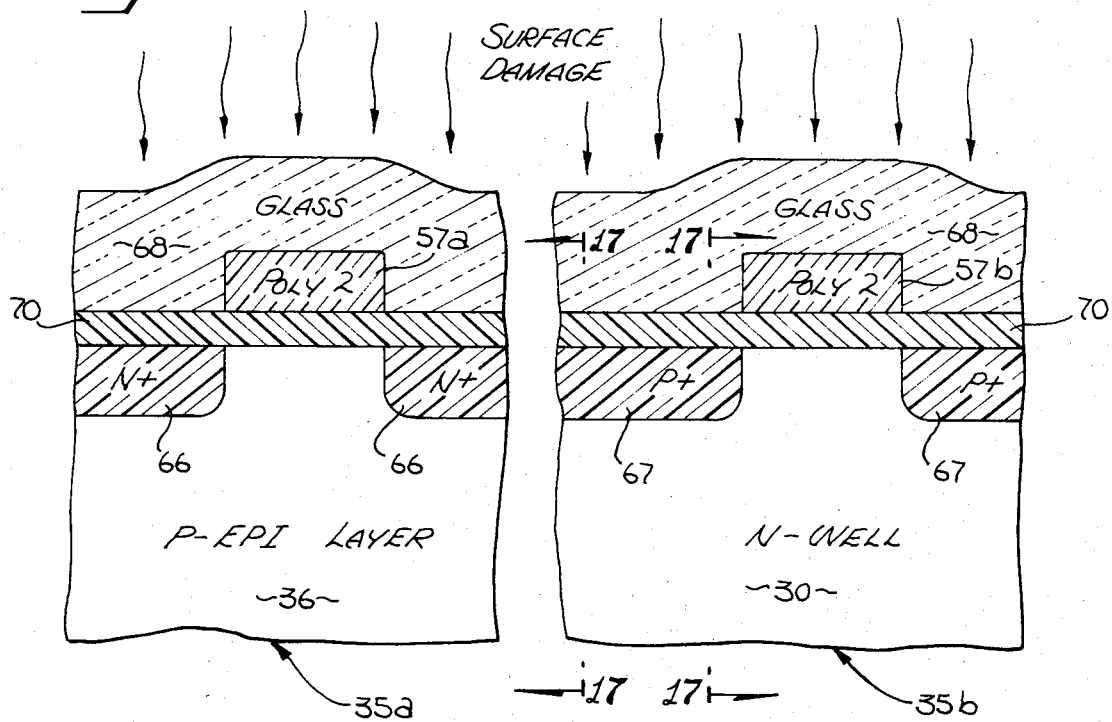
FIG. 16 illustrates the structure of FIG. 15 after a glass layer is formed over the structure.

An annealing step is not used at this point in the processing, but rather, a low temperature, chemical vapor silicon dioxide layer 68 is formed over the substrate as shown in FIG. 16. It has been found that best results are achieved if the layer includes approximately 8% phosphorus by weight (a 1 micron thick layer is used). This percentage of phosphorus has been found to be low enough to prevent corrosion when the integrated circuit is encapsulated in a plastic package and high enough for glass reflow. A glass reflow step is used by ramping the temperature to approximately 950 degrees C. in a wet atmosphere. The wafers are maintained at the high temperature for approximately 10 minutes; this has been found to provide sufficient reflow and yet prevent significant lateral diffusion of the p-type dopants. The upper surface of the layer 68 is then damaged, for example, with an arsenic implantation.

Next, as shown in FIG. 17, opening 71 is formed through the glass layer 68 and silicon dioxide layer 70. The opening 71 is shown contacting the region 67. The steps used to form this opening are described in U.S. Pat. No. 4,372,034.

Now a conductive layer 72 is formed. In the presently preferred embodiment, this layer is an aluminum layer with 1% silicon. After this conductive layer is patterned, a layer 74 of approximately 0.5 microns in thickness of chemically vapored deposited silicon dioxide is formed over the conductive layer followed by a 1 micron thick NITROX layer 75 (see FIG. 18). Finally, the bonding pads for the integrated circuit are formed in a well known manner.

Thus, a CMOS process has been described which is particularly suited for forming dynamic memory cells. Unique etching of the first layer provides good step coverage for the second polysilicon layer without troublesome stringers. Field-oxide regions in the array are etched back to reduce the bird-beaks and increase the capacitor storage area. A tri-layer dielectric is used to increase the performance of the cells and unique "rear-end" processing is used.

We claim:

1. In the fabrication of metal-oxide-semiconductor integrated circuits, a process for defining patterns in a polysilicon layer comprising the steps of:

growing a silicon dioxide layer on the upper surface of said polysilicon layer;

forming a second silicon dioxide layer over said grown silicon dioxide layer by using a chemical vapor deposition step;

forming a photoresist layer over said second silicon dioxide layer;

defining patterns in said photoresist layer;

etching said second silicon dioxide layer employing a wet etchant such that said second silicon dioxide layer is undercut under said photoresist layer;

etching said grown silicon dioxide layer in alignment with said photoresist layer employing an anisotropic etching step;

etching said polysilicon layer employing a wet etch such that undercutting of said polysilicon layer occurs beneath said grown silicon dioxide layer;

removing portions of said grown silicon dioxide layer which extended from between said polysilicon layer and said second silicon dioxide layer;

whereby a well-sloped surface is defined along the etched edges of said grown and second silicon dioxide layers and polysilicon layer, allowing better formation of subsequent layers on said etched surfaces.

2. The process defined by claim 1, including the steps of subjecting said polysilicon layer to an oxidation step so as to grow an oxide on the exposed surfaces of said polysilicon layer and forming a second polysilicon layer over said second silicon dioxide layer and said etched edges.

3. The process defined by claim 1 wherein said polysilicon layer is formed over an n-well, and wherein said patterns define openings in said layer for field-effect transistors for dynamic memory cells.

4. The process defined by claim 3 wherein said polysilicon layer forms a continuous plate for capacitors for said dynamic memory cells.

5. The process defined by claim 1 including the step of forming a second polysilicon layer over said second silicon dioxide layer and said etched edges so as to form a buried contact between said polysilicon layers.

* * * * *

UNITED STATES PATENT AND TRADEMARK OFFICE
CERTIFICATE OF CORRECTION

PATENT NO. : 4,505,026

DATED : Mar. 19, 1985

INVENTOR(S) : Bohr et al.

It is certified that error appears in the above-identified patent and that said Letters Patent is hereby corrected as shown below:

| COLUMN | LINE | DESCRIPTION |
| --- | --- | --- |
| 7 | 10 | Between the words "first" and "layer" please insert --polysilicon--. |

Signed and Sealed this

Sixth Day of October, 1987

Attest:

DONALD J. QUIGG

Attesting Officer

Commissioner of Patents and Trademarks